(12) United States Patent
Luong et al.

(10) Patent No.: US 9,978,563 B2
(45) Date of Patent: May 22, 2018

(54) PLASMA TREATMENT METHOD TO MEET LINE EDGE ROUGHNESS AND OTHER INTEGRATION OBJECTIVES

(71) Applicant: Tokyo Electron Limited, Minato-ku, Tokyo (JP)

(72) Inventors: Vinh Luong, Guilderland, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/266,397

(22) Filed: Sep. 15, 2016

(65) Prior Publication Data

US 2017/0213700 A1    Jul. 27, 2017

Related U.S. Application Data

(60) Provisional application No. 62/287,718, filed on Jan. 27, 2016.

(51) Int. Cl.
*H01L 21/302* (2006.01)
*H01J 37/32* (2006.01)
(Continued)

(52) U.S. Cl.
CPC .... *H01J 37/32082* (2013.01); *H01J 37/3244* (2013.01); *H01J 37/32165* (2013.01);
(Continued)

(58) Field of Classification Search
CPC ......... H01L 21/31138; H01L 21/31144; H01L 21/31058; H01L 21/76224; H01L 21/0274;
(Continued)

(56) References Cited

U.S. PATENT DOCUMENTS 6,623,652 B1 * 9/2003 Hsiao .................... G11B 5/102
216/22
7,579,278 B2    8/2009 Sandhu
(Continued)

FOREIGN PATENT DOCUMENTS

| JP | 2014-075578 | 4/2014 |
| JP | 2015-050201 | 3/2015 |
| KR | 10-2009-0036031 | 4/2009 |

OTHER PUBLICATIONS

International Patent Application No. PCT/US2017/014902, "International Search Report and Written Opinion," dated Apr. 28, 2017, International Patent Application filed Jan. 25, 2017.
(Continued)

*Primary Examiner* — Lan Vinh
(74) *Attorney, Agent, or Firm* — Wood Herron & Evans LLP

(57) ABSTRACT

Provided is a method of patterning a layer on a substrate using an integration scheme, the method comprising: disposing a substrate having a structure pattern layer, a neutral layer, and an underlying layer, the structure pattern layer comprising a first material and a second material; performing a first treatment process using a first process gas mixture to form a first pattern, the first process gas comprising a mixture of $C_xH_yF_z$ and argon; performing a second treatment process using a second process gas mixture to form a second pattern, the second process gas comprising a mixture of low oxygen-containing gas and argon; concurrently controlling selected two or more operating variables of the integration scheme in order to achieve target integration objectives.

20 Claims, 13 Drawing Sheets

(51) Int. Cl.
*H01L 21/027* (2006.01)
*H01L 21/3105* (2006.01)
*B81C 1/00* (2006.01)

(52) U.S. Cl.
CPC ...... *H01L 21/0274* (2013.01); *B81C 1/00531* (2013.01); *H01L 21/31058* (2013.01)

(58) Field of Classification Search
CPC ............ H01J 37/3266; H01J 37/32651; B81C 1/0053
USPC ....... 438/694, 706, 710, 712, 714, 719, 723, 438/736
See application file for complete search history.

(56) References Cited

U.S. PATENT DOCUMENTS

| | | |
|---|---|---|
| 7,723,009 B2 | 5/2010 | Sandhu et al. |
| 2004/0266202 A1* | 12/2004 | Bandy ................ H01L 21/0271 438/706 |
| 2009/0011589 A1* | 1/2009 | Jeon ...................... H01L 27/115 438/594 |
| 2009/0155731 A1* | 6/2009 | Urakawa ........... H01L 21/32139 430/323 |
| 2011/0042301 A1* | 2/2011 | Zhang .................. B01D 67/006 210/500.21 |
| 2011/0201201 A1* | 8/2011 | Arnold .................. B82Y 30/00 438/694 |
| 2012/0196211 A1* | 8/2012 | Masunaga ............. G03F 7/0045 430/5 |
| 2013/0140272 A1 | 6/2013 | Koole et al. |
| 2014/0272723 A1 | 9/2014 | Somervell et al. |
| 2015/0048049 A1 | 2/2015 | Nishimura et al. |

OTHER PUBLICATIONS

Taiwanese Intellectual Property Office, English translation of Notification of Examination Opinion issued in counterpart TW Application No. 106103094 dated Aug. 11, 2017, 8 pp.

* cited by examiner

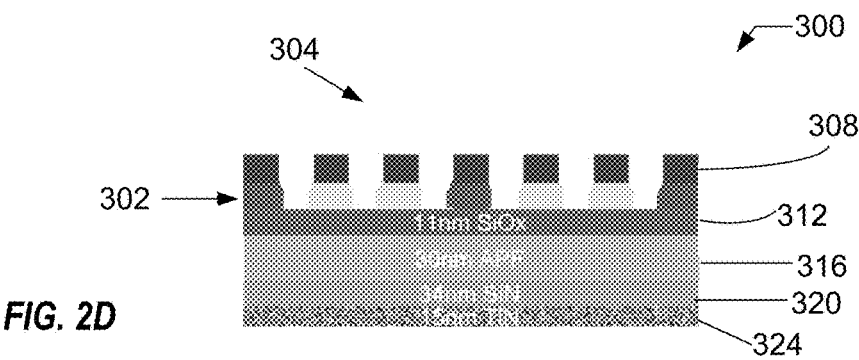
*FIG. 2D*
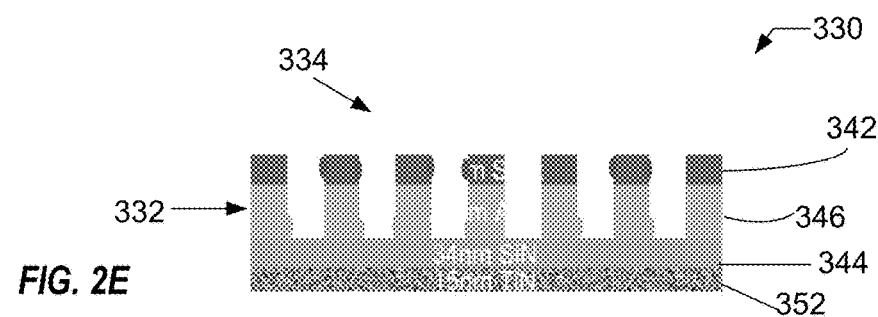
*FIG. 2E*
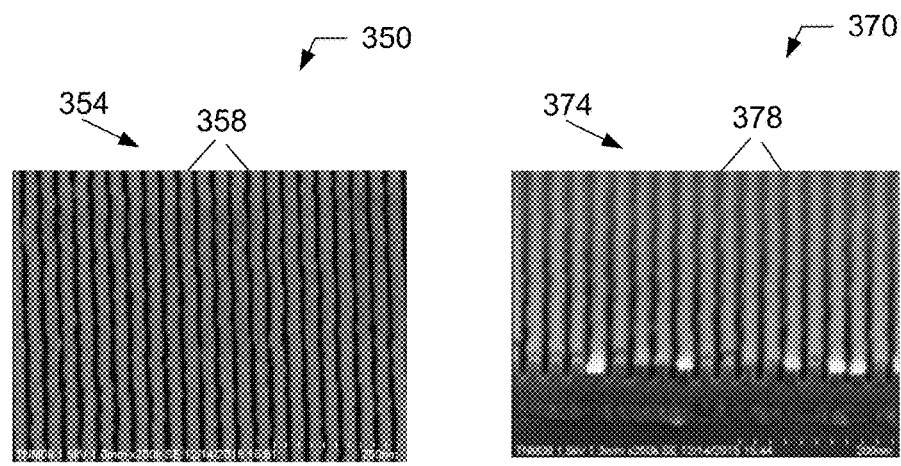
FIG. 3A BASE CASE  FIG. 3B

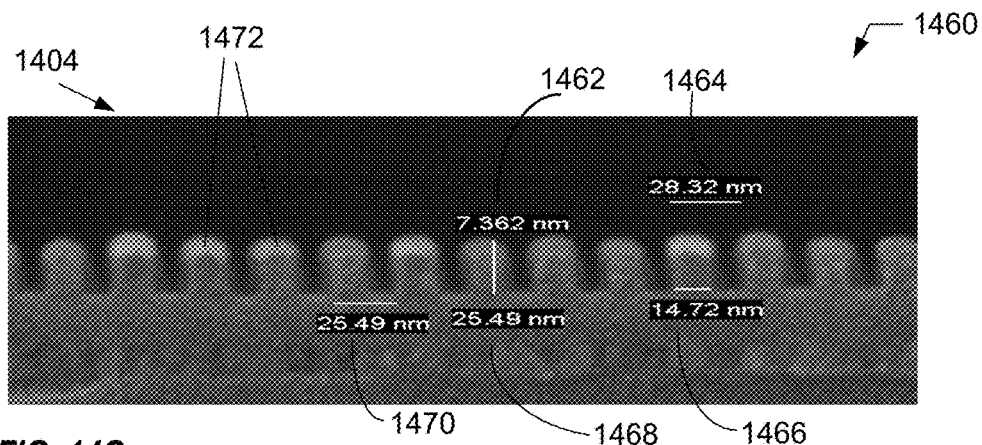
FIG. 14C
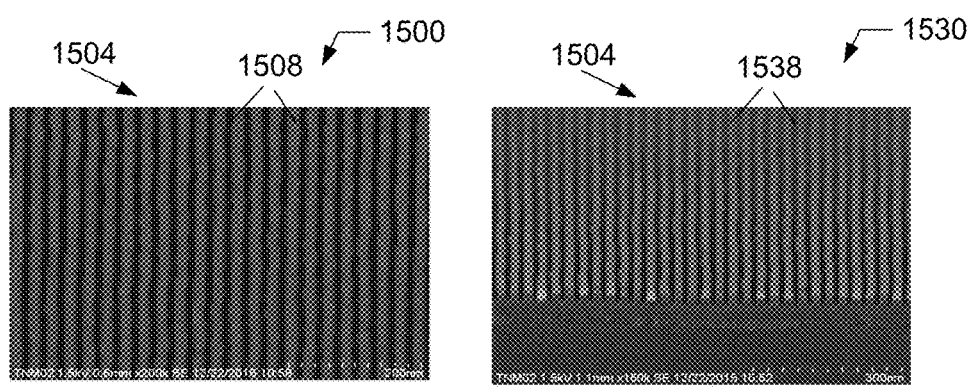
FIG. 15A
FIG. 15B
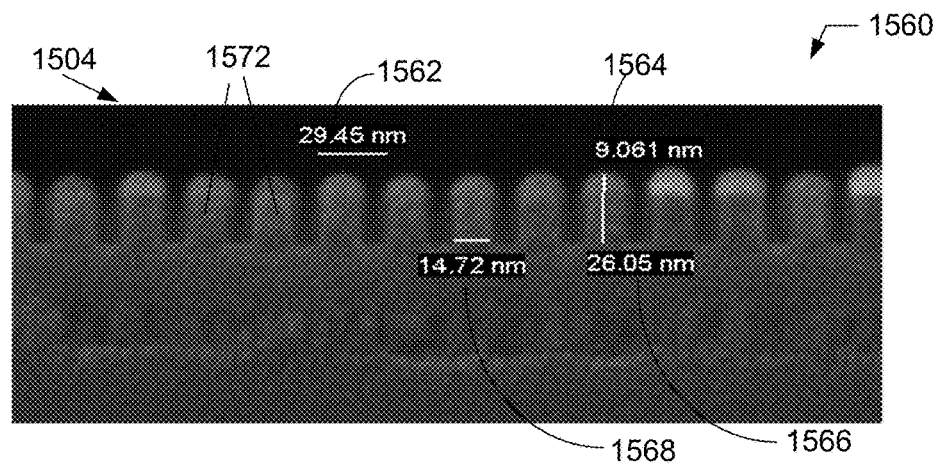
FIG. 15C

PLASMA TREATMENT METHOD TO MEET LINE EDGE ROUGHNESS AND OTHER INTEGRATION OBJECTIVES

BACKGROUND OF THE INVENTION

Field of Invention

The invention relates to a method for selectively etching a structure pattern having a first and a second material layer on a substrate and specifically to reducing line edge roughness (LER) and achieve other target integration objectives in a directed self-assembly (DSA) process.

Description of Related Art

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Photolithography is a standard technique used to manufacture semiconductor integrated circuitry by transferring geometric shapes and patterns on a mask to the surface of a semiconductor wafer. However, current state-of-the-art photolithography tools allow minimum feature sizes down to about 25 nm. Accordingly, new methods are needed to provide smaller features.

One type of structure pattern layer with a first and second material is a DSA layer. DSA layers include self-assembly of block copolymers (BCPs) which has been considered a potential tool for improving the resolution to better values than those obtainable by prior art lithography methods alone. Block copolymers are compounds useful in nanofabrication because they may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film, the geometric confinement may pose additional boundary conditions that may limit the numbers of phases. In general, spherical (e.g., cubic), cylindrical (e.g., tetragonal or hexagonal) and lamellar phases (i.e., self-assembled phases with cubic, hexagonal or lamellar space-filling symmetry) are practically observed in thin films of self-assembled block copolymers, and the phase type observed may depend upon the relative volume fractions of the different polymer blocks. The self-assembled polymer phases may orient with symmetry axes parallel or perpendicular to the substrate and lamellar and cylindrical phases are interesting for lithography applications, as they may form line and spacer patterns and hole arrays, respectively, and may provide good contrast when one of the domain types is subsequently etched.

Two methods used to guide or direct self-assembly of a block copolymer onto a surface are grapho-epitaxy and chemical pre-patterning, also called chemi-epitaxy. In the grapho-epitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance, if the block copolymer is a di-block copolymer with A and Bblocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In chemi-epitaxy, the self-assembly of block copolymer domains is guided by a chemical pattern (i.e., a chemical template) on the substrate. Chemical affinity between the chemical pattern and at least one of the types of copolymer blocks within the block copolymer chain may result in the precise placement (also referred to herein as "pinning") of one of the domain types onto a corresponding region of the chemical pattern on the substrate. For instance, if the block copolymer is a di-block copolymer with A and B blocks, where A is hydrophilic and B is hydrophobic in nature, and the chemical pattern comprises of a surface having hydrophobic regions adjacent to regions that are neutral to both A and B, the B domain may preferentially assemble onto the hydrophobic region and consequently force subsequent alignment of both A and B blocks on the neutral areas. As with the grapho-epitaxy method of alignment, the resolution may be improved over the resolution of the patterned substrate by the block copolymer pattern subdividing the spacing of pre-patterned features on the substrate (so-called density or frequency multiplication). However, chemi-epitaxy is not limited to a linear pre-pattern; for instance, the pre-pattern may be in the form of a 2-D array of dots suitable as a pattern for use with a cylindrical phase-forming block copolymer. Grapho-epitaxy and chemi-epitaxy may be used, for instance, to guide the self-organization of lamellar or cylindrical phases, where the different domain types are arranged side-by-side on a surface of a substrate.

Accordingly, to achieve the advantages provided by grapho-epitaxy and chemi-epitaxy of block copolymers, new lithographic patterning and directed self-assembly techniques are required, including the ability to integrate such materials in patterning workflows. One example of a block copolymer is polystyrene-b-poly(methyl methacrylate) (PMMA). However, when removing the PMMA portion from the polystyrene-b-poly(methyl methacrylate) (PS-b-PMMA) layer to leave behind a polystyrene (PS) pattern, conventional etching techniques have suffered. Due to the organic nature of both materials, and their similarities, developing an etch chemistry with suitable etch selectivity has been challenging. Furthermore, conventional etch processes produce pattern defectivity, such as line edge roughness/line width roughness (LER/LWR), that are unacceptable as per the semiconductor device performance requirements. In extreme cases, the defectivity of the PS can be catastrophic due to pattern collapse as will be discussed in more detail below.

In future schemes, the ability to selectively remove one material while retaining the other material using dry etching techniques is paramount for the success for such patterning implementation. As mentioned above, acceptable critical dimension (CD), LER/LWER and etch selectivity are major factors that determine usefulness of an integration process that is used for self-aligned quadruple patterning (SAQP)

process. The current methods do not provide the CD, LER, and LWR that are required as the need for higher density patterns increases. There is also a need to ascertain the combination of flowrates or ratios of etchant gases or combination of gases that provide the etch sensitivity required. Overall, there is a need for controlled etching techniques, processes, combination of etchant gases that produce acceptable etch selectivity, and LER results in order to achieve integration objectives with smaller features.

SUMMARY OF THE INVENTION

Provided is a method of patterning a layer on a substrate using an integration scheme, the method comprising: disposing a substrate having a structure pattern layer, a neutral layer, and an underlying layer, the structure pattern layer comprising a first material and a second material; performing a first treatment process using a first process gas mixture to form a first pattern, the first process gas comprising a mixture of $C_xH_yF_z$ and argon; performing a second treatment process using a second process gas mixture to form a second pattern, the second process gas comprising a mixture of low oxygen-containing gas and argon; concurrently controlling selected two or more operating variables of the integration scheme in order to achieve target integration objectives.

BRIEF DESCRIPTION OF THE DRAWINGS

In the accompanying drawings:

FIG. 2D depicts schematic of the substrate a second process gas mixture to form a second pattern on the substrate, the second process gas comprising a mixture of low oxygen-containing gas and argon according to an embodiment. FIG. 2E depicts a schematic of the substrate after undergoing a spin-on-glass (SOG) and a spin-on-carbon (SOC) etch processes.

FIG. 3A is an exemplary top-view image of the resulting pattern structure in the substrate after the series of prior art processes are performed, the image being used as a base case for comparing results produced in the present invention. FIG. 3B depicts a tilted image of the substrate shown in FIG. 3A.

FIG. 9A depicts a combined top-view and tilted-view of the substrate pattern structure of the polystyrene (PS) without the C4F8/Ar treatment while

FIG. 10A depicts a combined top-view and tilted-view of the substrate pattern structure of the polystyrene (PS) without the CH4/Ar treatment while

FIG. 11A depicts a combined top-view and tilted-view of the substrate pattern structure of the polystyrene (PS) without the CH4/Ar treatment while FIG. 11B depicts a combined top-view and tilted-view of the substrate pattern structure of the polystyrene (PS) with the CH4/Ar first treatment, the images taken after the APF open etch process.

FIG. 14C is a side-view of the line and space image with the CHF3/Ar first treatment, the images taken after a full oxide and APF etch processes.

FIG. 15A depicts a top-view of the line and space image, where FIG. 15B depicts a tilted-view of the of the line and space image, and where FIG. 15C is a side-view of the line and space image with the CH3/Ar first treatment, the images taken after a full oxide and APF etch processes.

FIG. 17A is an exemplary graph of the deposition rate of the plasma species as a function of Ar flow rate in the first treatment process of the structure pattern whereas FIG. 17B is an exemplary graph of the deposition rate of the plasma species as a function of C4F8 flow rate in the first treatment process of the structure pattern, and whereas

DETAILED DESCRIPTION OF SEVERAL EMBODIMENTS

Figure 1A:
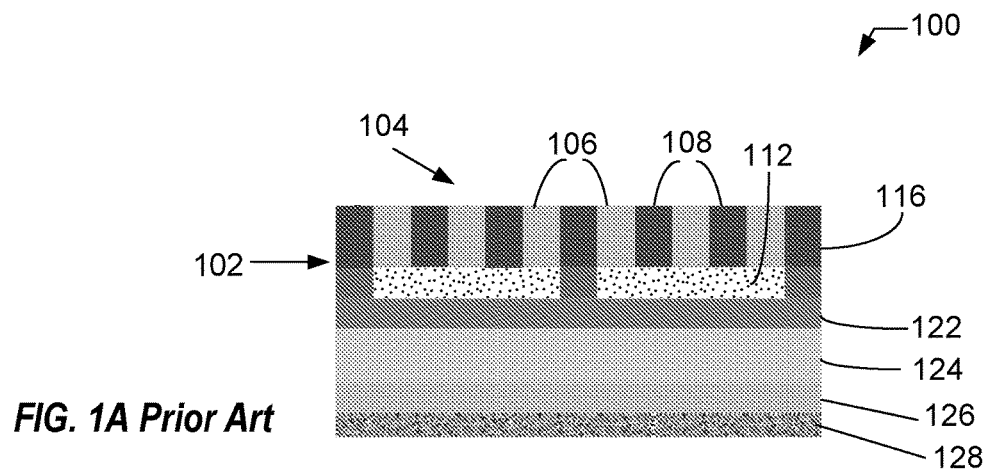
FIG. 1A depicts a prior art schematic of an input substrate at the beginning of the directed self-assembly patterning process.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $X^N$ value, with other polymer blocks of unlike monomer types, that is sufficient for phase separation to occur. X is the Flory-Huggins interaction parameter and N is the total degree of polymerization for the block copolymer. According to embodiments of the present invention, the $X^N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $X^N$>10.5) for those blocks to phase separate. A wide variety of block polymers are contemplated herein including di-block copolymers (i.e., polymers including two polymer blocks (AB)), tri-block copolymers (i.e., polymers including Xthree polymer blocks (ABA or ABC)), multi-block copolymers (i.e., polymers including more than three polymer blocks (ABCD, etc.)), and combinations thereof.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

The terms "microphase segregation" and "microphase separation," as used herein mean and include the properties by which homogeneous blocks of a block copolymer aggregate mutually, and heterogeneous blocks separate into distinct domains. In the bulk, block copolymers can self-assemble into ordered morphologies, having spherical, cylindrical, lamellar, bicontinuous gyroid, or miktoarm star microdomains, where the molecular weight of the block copolymer dictates the sizes of the microdomains formed.

The domain size or pitch period ($L_o$) of the self-assembled block copolymer morphology may be used as a basis for designing critical dimensions of the patterned structure. Similarly, the structure period ($L_s$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that identical blocks aggregate together, thereby forming alternating regions containing each block type or species. For example, if the copolymers are formed of polar (e.g., organometallic containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

In addition to interactions between the polymer block species, the self-assembly of block copolymers can be influenced by topographical features, such as steps or guides extending perpendicularly from the horizontal surface on which the block copolymers are deposited. For example, a di-block copolymer, a copolymer formed of two different polymer block species, may form alternating domains, or regions, which are each formed of a substantially different polymer block species. When self-assembly of polymer block species occurs in the area between the perpendicular walls of a step or guides, the steps or guides may interact with the polymer blocks such that, e.g., each of the alternating regions formed by the blocks is made to form a regularly spaced apart pattern with features oriented generally parallel to the walls and the horizontal surface.

Such self-assembly can be useful in forming masks for patterning features during semiconductor fabrication processes. For example, one of the alternating domains may be removed, thereby leaving the material forming the other region to function as a mask. The mask may be used to pattern features such as electrical devices in an underlying semiconductor substrate. Methods for forming a block copolymer mask are disclosed in U.S. Pat. Nos. 7,579,278; 7,723,009, and to U.S. application Ser. No. 13/830,859, CHEMI-EPITAXY IN DIRECTED SELF-ASSEMBLY APPLICATIONS USING PHOTO-DECOMPOSABLE AGENTS, by Sommervell, et al., filed on Mar. 14, 2013, the entire disclosure of each of which is incorporated by reference herein.

In material processing methodologies, pattern etching can comprise the application of a thin layer of radiation-sensitive material, such as photo-resist, to an upper surface of a substrate, followed by patterning of the thin layer of material using lithographic techniques. In DSA patterning, the initial pattern is formed by the phase-separation of two or more phases present in a DSA layer, the selective removal of at least one phase using dry pattern etching, and the retention of at least one remaining phase, thereby providing a pattern for subsequent dry pattern etching. During dry pattern etching, a plasma etching process can be utilized, wherein plasma is formed from a process gas by coupling electromagnetic (EM) energy, such as radio frequency (RF) power, to the process gas in order to heat electrons and cause subsequent ionization and dissociation of the atomic and/or molecular constituents of the process gas. Using a series of dry etching processes, the initial pattern may be formed in the DSA layer, followed by transfer of the pattern to the underlying layers within a film stack, including the one or more material layers that are desired for the end product, e.g., electronic device. To do so, the selective removal of one material relative to other material(s) is necessary. And, among other things, during the pattern transfer process, profile control for the pattern extended into underlying layers is of critical importance.

As described above, directed self-assembled block copolymer layers, such as polystyrene-b-poly(methyl methacrylate) (PS-b-PMMA), have proven useful in sub-22 nm patterning schemes. However, to remove the self-assembled PMMA portion while retaining the PS portion, a highly selective etch process is required.

Referring now to the drawings, wherein like reference numerals designate identical or corresponding parts throughout the several views, FIG. 1A depicts a prior art schematic 100 of a substrate 104 at the beginning of the directed self-assembly patterning process. The top layer 116 is a structure pattern 102 that includes a first material 106 and a second material 108. The first material 106 and second material 108 can be directed self-assembly materials. Directed self-assembly materials can be block copolymers (BCP). The first material 106 can be a first block copolymer and the second material 108 can be a second block copolymer. The first block copolymer can be PMMA and a second copolymer can be polystyrene (PS). Connecting two second materials 108 is neutral layer 112. The next layers include a silicon oxide layer 122, an advanced pattern film (APF) layer 124, a silicon nitride layer 126, and a titanium nitride layer 128.

Figure 1B:
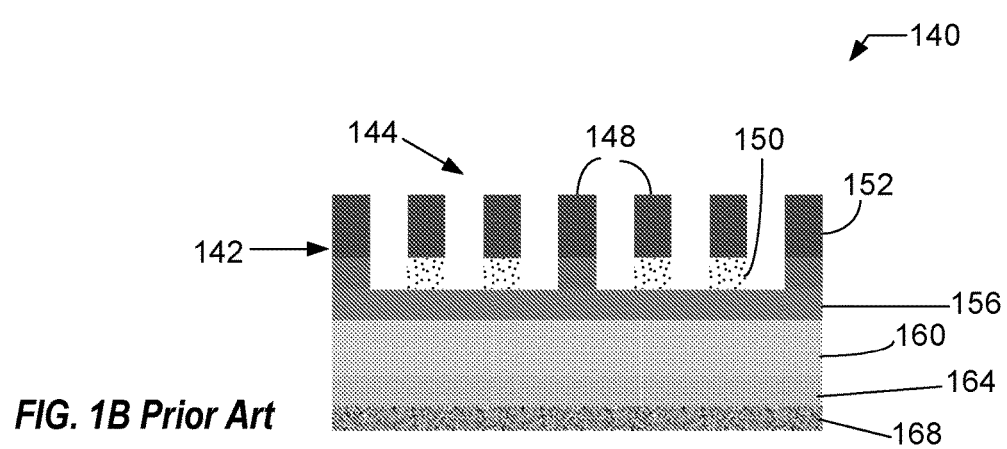
FIG. 1B depicts a prior art schematic of a substrate after the copolymer, neutral layer, and cure etch processing of the input substrate.

FIG. 1B depicts a prior art schematic 140 of a structure pattern 142 in a substrate 144 after the first material and portions of neutral layer 150 are etched with the directed self-assembly patterning process, leaving the second material 148 and portions of the neutral layer 150. The patterning process includes a first material etch using a gas mixture comprising $O_2$/Ar, a null layer etch using a gas mixture comprising Ar, and a cure process using a gas mixture comprising HBr/Ar. The next layers include the silicon oxide layer 156, the APF layer 160, using a gas mixture comprising a silicon nitride layer 164, and a titanium nitride layer 168.

Figure 1C:
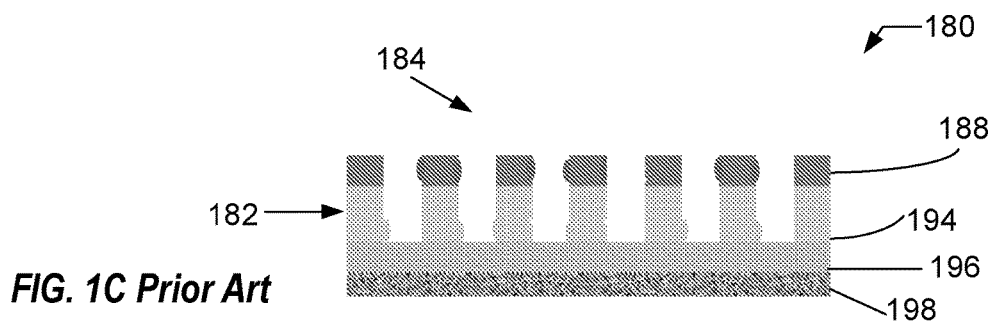
FIG. 1C depicts a prior art schematic of a substrate undergoing a spin-on-glass (SOG) and a spin-on-carbon (SOC) etch processes.

FIG. 1C depicts a prior art schematic 180 of a structure pattern 182 in a substrate 184 after undergoing a spin-on-glass (SOG) and a spin-on-carbon (SOC) etch processes. The SOG etch process uses a gas mixture comprising $C_4F_8$ and $O_2$. The SOC etch process uses a gas mixture comprising $H_2/N_2$ to transfer the pattern through the silicon oxide layer 188 and through the APF layer 194, leaving the silicon nitride layer 196 and a titanium nitride layer 198.

Figure 2A:
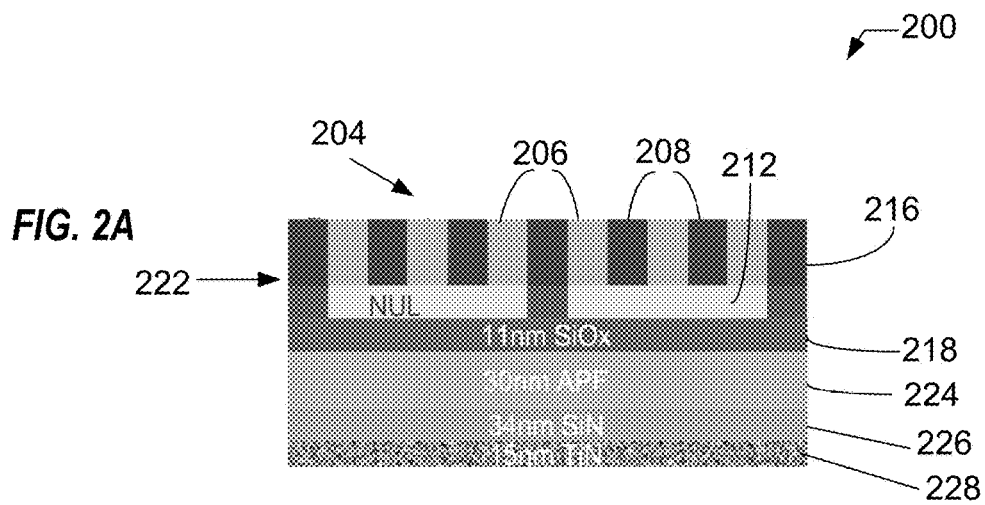
FIG. 2A depicts a schematic of an input substrate at the beginning of the directed self-assembly patterning process according to an embodiment of the present invention.

FIG. 2A depicts a schematic 200 of an input substrate 204 at the beginning of the patterning process of structure pattern 222 having a first material 206 and a second material 208 according to an embodiment of the present invention. The processing steps are the same as those discussed in relation to FIG. 1A. The top layer 216 is a structure pattern 222 that includes a first material 206 and a second material 208. The first material 206 and second material 208 can each be a directed self-assembly material. Directed self-assembly materials can be block copolymers (BCP). The first material 206 can be a first block copolymer and the second material 208 can be a second block copolymer. The first block copolymer can be PMMA and a second copolymer can be polystyrene (PS). Connecting two second materials 208 is neutral layer 212. The next layers include a silicon oxide layer 218, an advanced pattern film (APF) layer 224, a silicon nitride layer 226, and a titanium nitride layer 228. The next layers can comprise similar other materials in addition to those listed above.

Figure 2B:
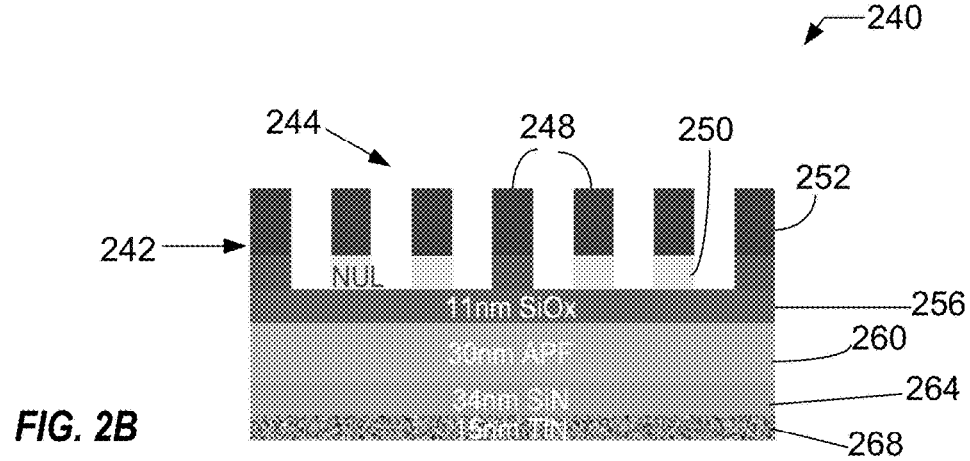
FIG. 2B depicts schematic of a substrate after the copolymer etch, neutral layer etch, and cure etch processing of the input substrate.

FIG. 2B depicts schematic 240 of a structure pattern 242 in a substrate 244 after the first material etch, neutral layer etch, and cure etch processing of the input substrate according to an embodiment of the present invention. The processing steps are the same as those discussed in relation to FIG. 1B. The first material and portions of neutral layer 250 are etched with the directed self-assembly patterning process, leaving the second material 248 and portions of the neutral layer 250. The patterning process includes a first material etch using a gas mixture comprising $O_2$/Ar, a null layer etch using a gas mixture comprising Ar, and a cure process using a gas mixture comprising HBr/Ar. The next layers include the silicon oxide layer 256, the APF layer 260, a silicon nitride layer 264, and a titanium nitride layer 268.

The next layers can comprise similar other materials in addition to those listed above.

Figure 2C:
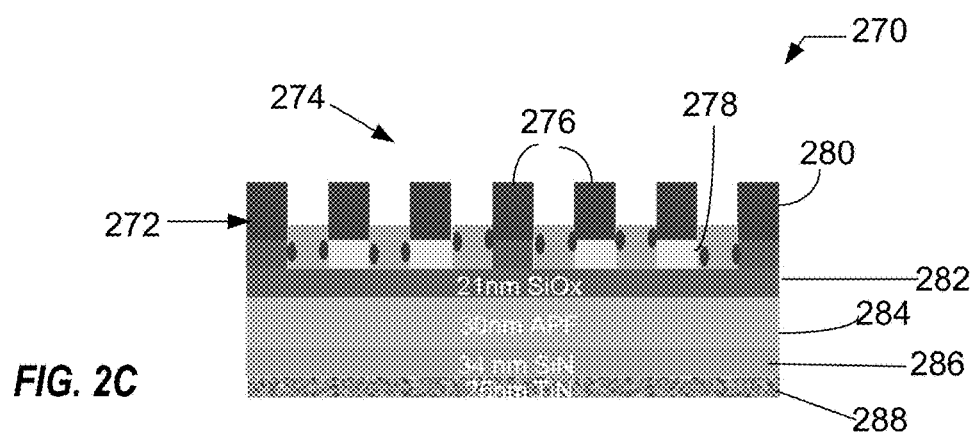
FIG. 2C depicts a schematic of the substrate after a first treatment process using a first process gas mixture to form a first pattern on the substrate.

FIG. 2C depicts a schematic 270 of a structure pattern 272 in the substrate 274 after a first treatment process using a first process gas mixture to form a first pattern 280 on the substrate 274 according to an embodiment of the present invention. A first treatment process using a first process gas is used to form a first pattern 280 on the substrate 274, the first pattern 280 comprising a portion of the second material 276 on top of the neutral layer 278. The first process gas mixture comprises a mixture of $C_xH_yF_z$ and argon. The $C_xH_yF_z$ can be C4F8/AR, CH4/Ar, CH3/Ar, or CHF3/Ar. The $C_xH_yF_z$ can have a flowrate from 20 to 35 sccm and the argon can have a flowrate from 40 to 60 sccm. The next layers include the silicon oxide layer 282, the APF layer 284, a silicon nitride layer 286, and a titanium nitride layer 288. The next layers can comprise similar other materials in addition to those listed above.

FIG. 2D depicts schematic 300 of the structure pattern 302 in a substrate 304 after second treatment process is performed using a second process gas mixture to form a second pattern 308 on the substrate 304, the second process gas comprising a mixture of low oxygen-containing gas and argon according to an embodiment of the present invention. The low oxygen-containing gas can be O2 at 2 to 5 sccm and the Ar can be 40 to 70 sccm. The next layers include the silicon oxide layer 312, the APF layer 316, a silicon nitride layer 320, and a titanium nitride layer 324.

FIG. 2E depicts a schematic 330 of the structure pattern 332 including the top portion 334 in a substrate 334 after undergoing a spin-on-glass (SOG) and a spin-on-carbon (SOC) etch processes. The SOG etch process uses a gas mixture comprising C4F8 and O2. The SOC etch process uses a gas mixture comprising H2/N2 to transfer the pattern through the silicon oxide layer 342 and through the APF layer 346, leaving the silicon nitride layer 344 and a titanium nitride layer 352.

FIG. 3A is an exemplary top-view image 350 of the resulting pattern structure in the substrate 354 after the series of conventional directed self-aligned processes are performed. The image 350 of the line and space 358 of the substrate 354 is used as a base case for comparing results produced using the new processes of the present invention. FIG. 3B depicts a tilted image 370 of the substrate 374 highlighting the characteristics of the line and space 378 shown in FIG. 3A.

Figures 4A, 4B:
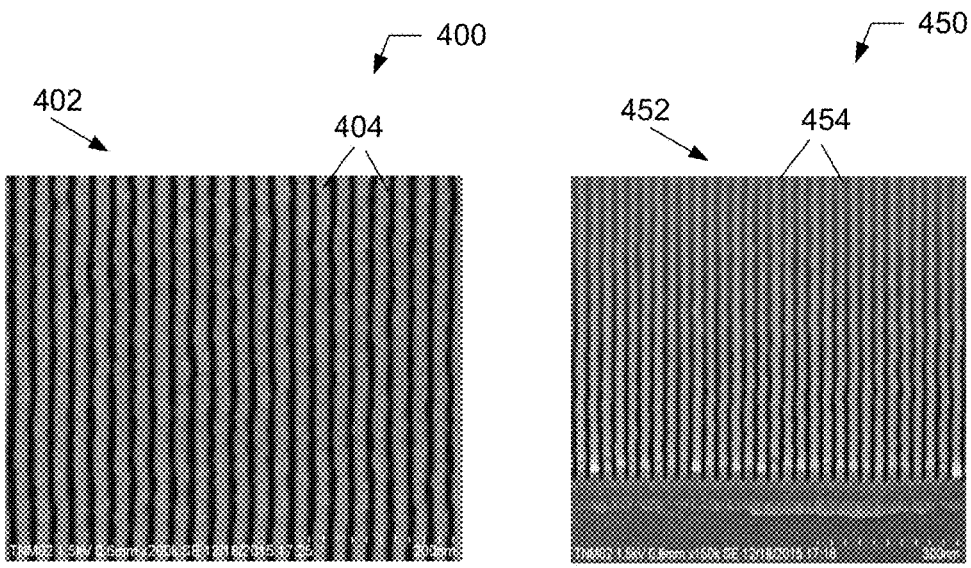
FIG. 4A and FIG. 4B depict images of a top-view and a tilted-view of the substrate processed with C4F8/Ar in the first process gas mixture according to an embodiment.

FIG. 4A and FIG. 4B depict images 400, 450 of a top-view and a tilted-view respectively of the substrate 402, 452 processed with C4F8/Ar in the first process gas mixture according to an embodiment. The images 400, 450 highlight the better quality in LER of the line and space 404, 454 of the substrate compared to the LER of the line and space 358, 378 of the base case processed with conventional techniques shown in FIG. 3A and FIG. 3B. The subject of LER achieved with the embodiments of the present invention compared to LER obtained in the base case utilizing prior art techniques is presented in a graph in FIG. 8.

Figures 5A, 5B:
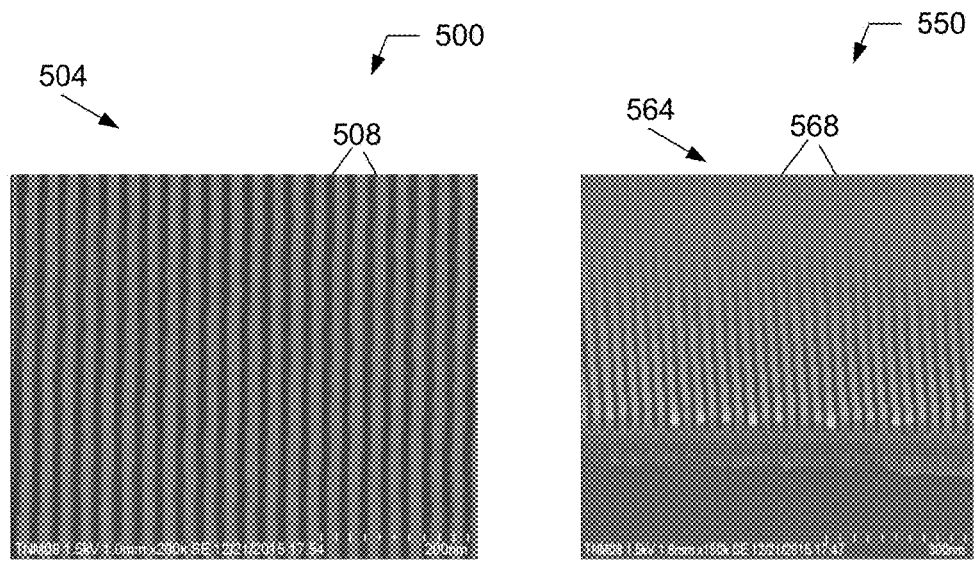
FIG. 5A and FIG. 5B depict images of a top-view and a tilted-view of the substrate processed with CH4/Ar in the first process gas mixture according to an embodiment.

FIG. 5A and FIG. 5B depict images 500, 550 of a top-view and a tilted-view of the substrate processed with CH4/Ar in the first process gas mixture according to an embodiment. The images 500, 550 highlight the better quality in LER of the line and space 508, 568 of the substrate 504, 564 compared to the LER of the line and space 358, 378 of the base case processed with conventional techniques shown in FIG. 3A and FIG. 3B.

Figure 6A:
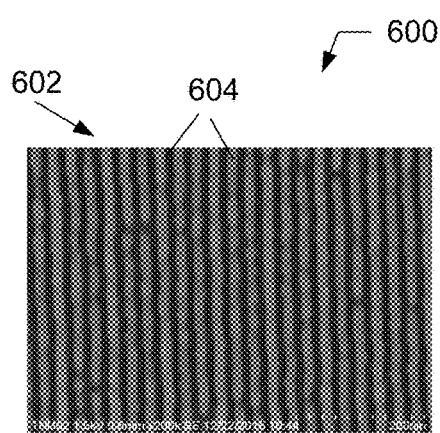
FIG. 6A and FIG. 6B depict images of a top-view and a tilted-view of the substrate processed with CHF3/Ar in the first process gas mixture according to an embodiment.
Figure 6B:
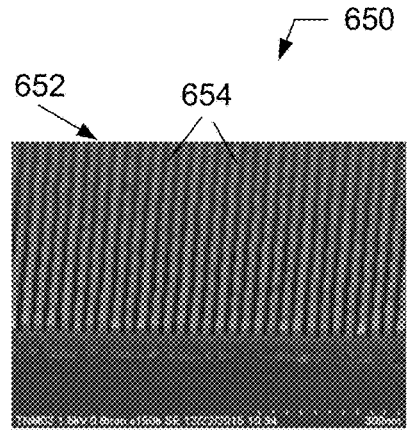

FIG. 6A and FIG. 6B depict images 600, 650 of a top-view and a tilted-view of the substrate processed with CHF3/Ar in the first process gas mixture according to an embodiment. The images 600, 650 highlight the better quality in LER of the line and space 604, 654 of the substrate 602, 652 compared to the LER of the line and space 358, 378 of the baseline case processed with conventional techniques shown in FIG. 3A and FIG. 3B.

Figure 7A:
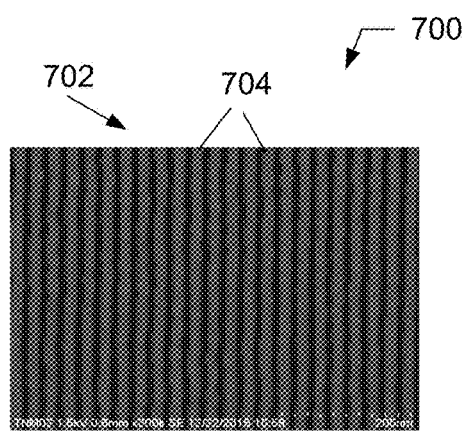
FIG. 7A and FIG. 7B depict images of a top-view and a tilted-view of the substrate processed with CH3/Ar in the first process gas mixture according to an embodiment.
Figure 7B:
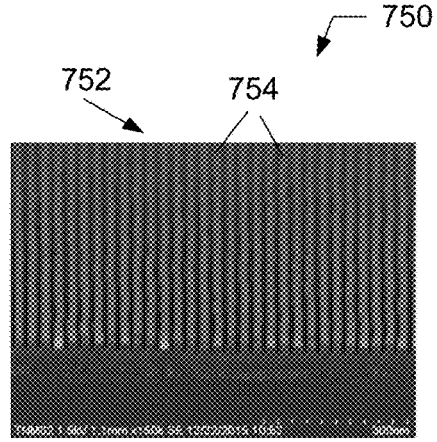

FIG. 7A and FIG. 7B depict images of a top-view 700 and a tilted-view 750 of the substrate processed with CH3/Ar in the first process gas mixture according to an embodiment. The images 700, 750 highlight the better quality in LER of the line and space 704, 754 of the substrate 702, 752 compared to the LER of the line and space 358, 378 of the baseline case processed with conventional techniques shown in FIG. 3A and FIG. 3B.

Figure 8:
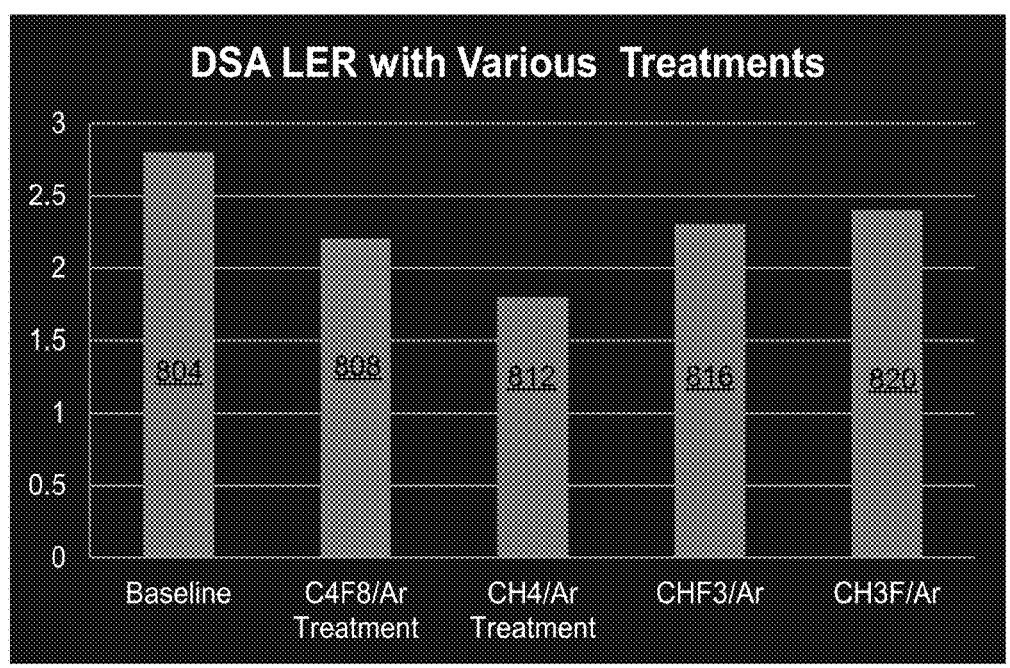
FIG. 8 is a composite graph of LER showing the baseline LER and LER achieved in the various new treatments in an embodiment.

FIG. 8 is a composite graph 800 of LER showing the baseline LER 804 and LER achieved in the various new treatments in an embodiment. The LER 812 at about 1.8 nm using CH4/Ar has the best LER; LER 808 at about 2.2 nm using C4F8/Ar is next; LER 816 at about 2.3 nm using CHF3/Ar is next; and finally LER 820 at about 2.4 nm using CH3/Ar is last but still better than LER 804 at about 2.8 nm of the baseline case that use conventional etching techniques. As mentioned above, the improvement of LER is a critical factor in getting the device performance needed as the size of the devices gets smaller.

Figure 9A:
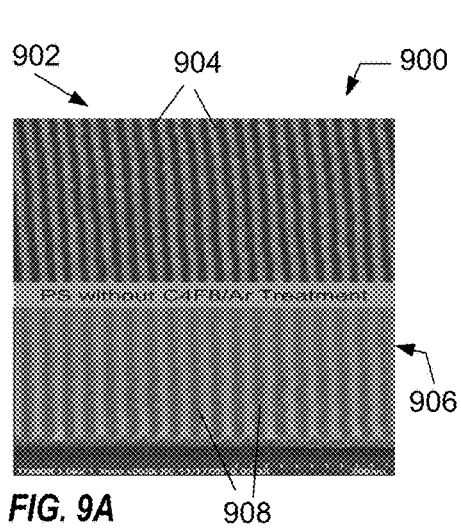
Figure 9B:
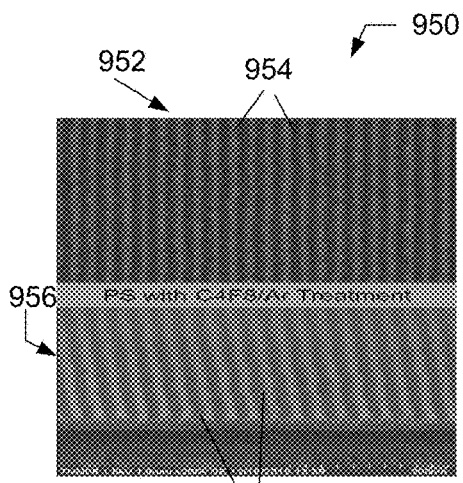
FIG. 9B depicts a combined top-view and tilted-view of the substrate pattern structure of the polystyrene (PS) with the C4F8/Ar treatment after all integration processes.

FIG. 9A depicts a combined top-view 900 and tilted-view 906 of the substrate 902 pattern structure of the polystyrene (PS) without the C4F8 treatment while FIG. 9B depicts a combined top-view 950 and tilted-view 956 of the substrate 952 pattern structure of the polystyrene (PS) with the C4F8/Ar treatment. The line and space image 954, 958 with the C4F8/Ar treatment has a substantially better LER than the line and space images 904, 908 without the treatment.

Figure 10A:
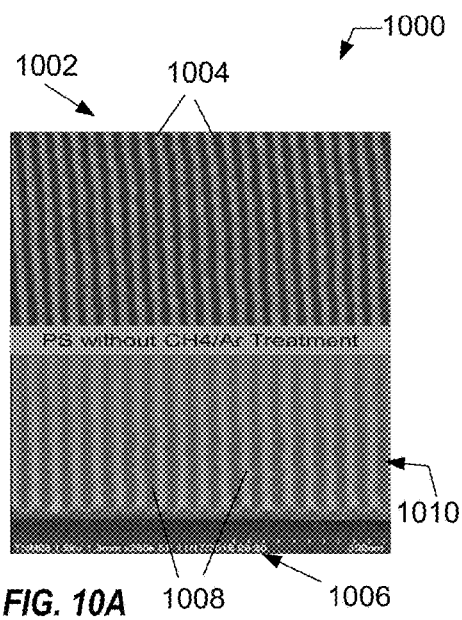
Figure 10B:
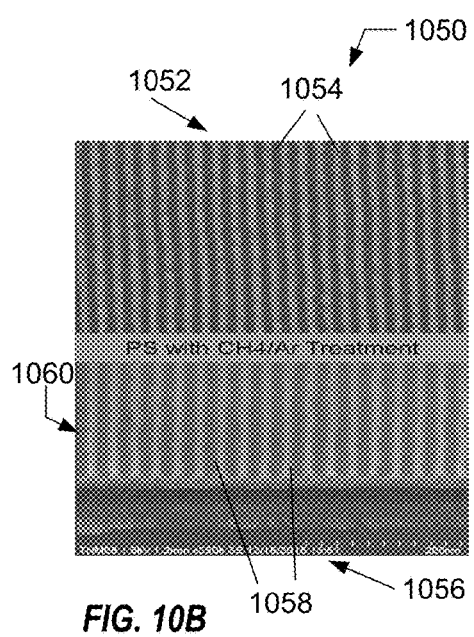
FIG. 10B depicts a combined top-view and tilted-view of the substrate pattern structure of the polystyrene (PS) with the CH4/Ar treatment after the PS open etch process.

FIG. 10A depicts a combined top-view 1000 and tilted-view 1010 of the substrate 1002 pattern structure of the polystyrene (PS) without the CH4 treatment while FIG. 10B depicts a combined top-view 1050 and tilted-view 1060 of the substrate 1052 pattern structure of the polystyrene (PS) with the CH4/Ar treatment. The line and space image 1054, 1058 with the CH4/Ar treatment has a substantially better LER than the line and space images 1004, 1008 without the treatment.

Figures 11A, 11B:
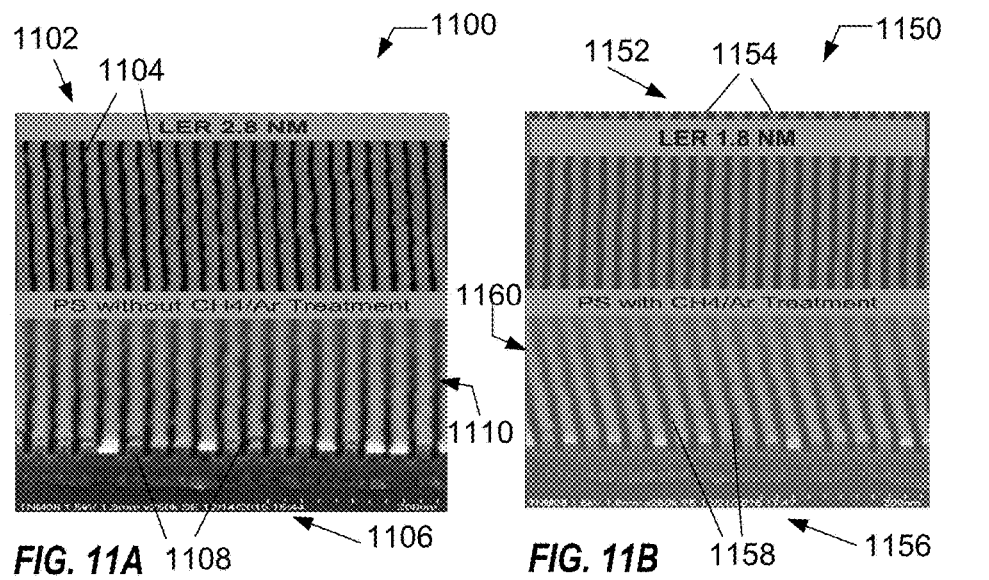

FIG. 11A depicts a combined top-view 1100 and tilted-view 1110 of the substrate 1102 pattern structure of the polystyrene (PS) without the CH4/Ar treatment while FIG. 11B depicts a combined top-view 1150 and tilted-view 1160 of the substrate 1152 pattern structure of the polystyrene (PS) with the CH4/Ar treatment. The line and space image 1154, 1158 top-view and tilted-view respectively, with the CH4/Ar treatment has a substantially better LER than the line and space images 1104, 1108 top-view and tilted-view respectively, without the treatment.

Figures 12A, 12B:
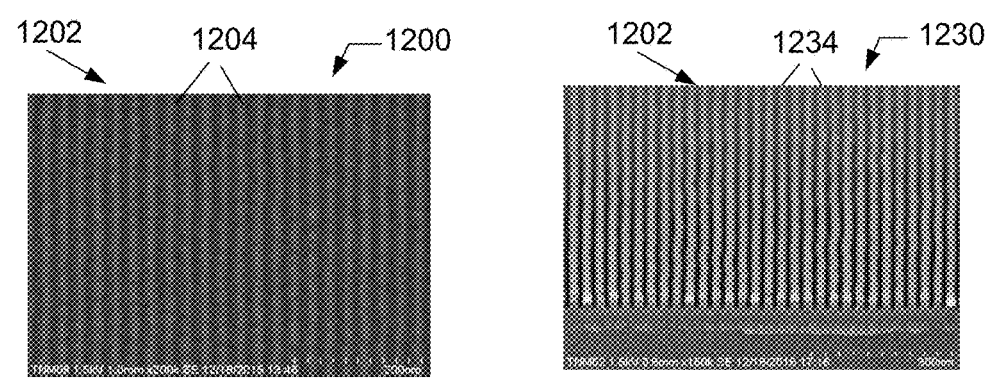
FIG. 12A depicts a top-view of the line and space image, where
FIG. 12B depicts a tilted-view of the of the line and space image, and where
Figure 12C:
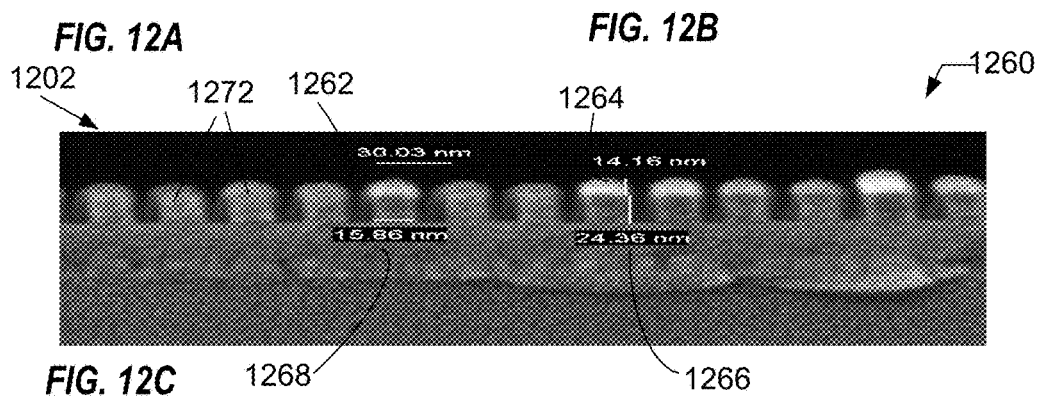
FIG. 12C is a side-view of the line and space image with the C4F8/Ar first treatment, the images taken after a full oxide and APF etch processes.

FIG. 12A depicts a top-view 1200 of the line and space image 1204 of substrate 1202, whereas FIG. 12B depicts a tilted-view 1230 of the of the line and space image 1234 of substrate 1202, and whereas FIG. 12C is a side-view 1260 of the line and space image 1272 of substrate 1202, with the C4F8/Ar first treatment, the images taken after the full oxide and the APF etch processes. FIG. 12C also shows the critical dimensions (CDs) of the structure including the pitch 1264, the bottom CD 1266, the height of the structure cap 1262 and the height below the structure cap 1268. Critical dimensions of the substrate are tightly controlled in various steps of the etching scheme in order to achieve the target integration objectives.

Figure 13A:
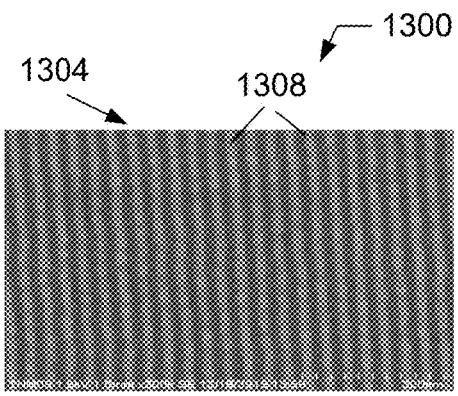
FIG. 13A depicts a top-view of the line and space image, where
Figure 13B:
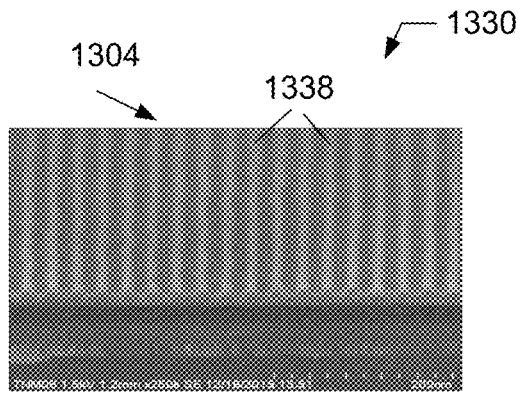
FIG. 13B depicts a tilted-view of the of the line and space image, and where
Figure 13C:
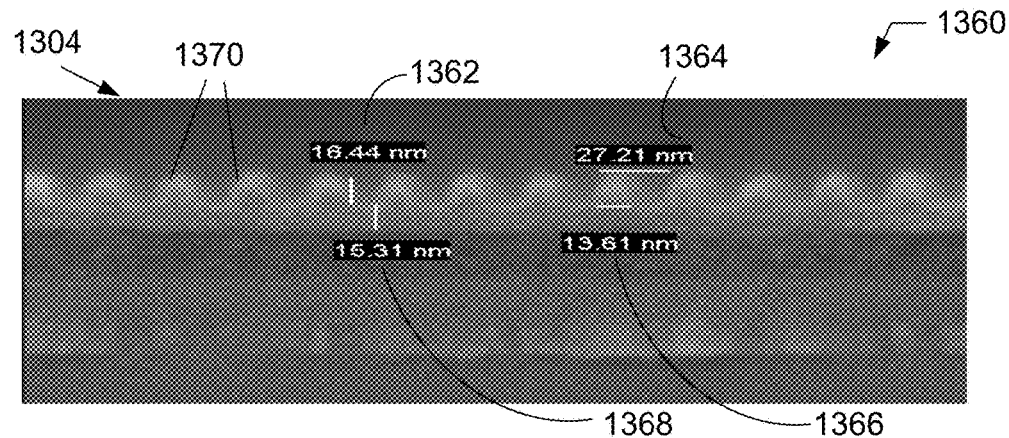
FIG. 13C is a side-view of the line and space image with the CH4/Ar first treatment, the images taken after a full oxide and APF etch processes.

FIG. 13A depicts a top-view 1300 of the line and space image 1304 of substrate 1302, whereas FIG. 13B depicts a tilted-view 1330 of the of the line and space image 1358 of substrate 1302, and whereas FIG. 13C is a side-view 1360 of the line and space image 1370 of substrate 1302 with the CH4/Ar first treatment, the images taken after the PS etch processes. FIG. 13C also shows the critical dimensions (CDs) of the structure including the pitch 1364, the bottom CD 1366, the height of the structure cap 1362 and the height below the structure cap 1368. Critical dimensions of the substrate are tightly controlled in various steps of the etching scheme in order to achieve the target integration objectives.

Figure 14A:
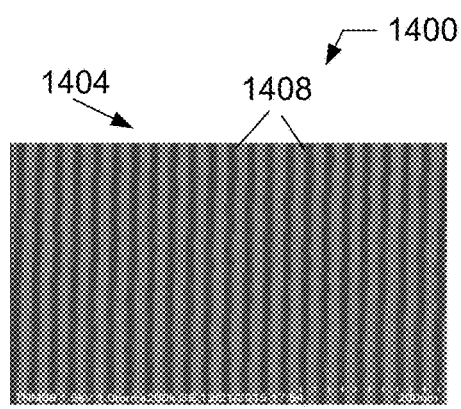
FIG. 14A depicts a top-view of the line and space image, where
Figure 14B:
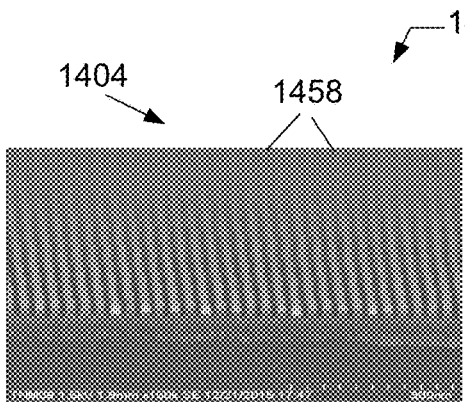
FIG. 14B depicts a tilted-view of the of the line and space image, and where

FIG. 14A depicts a top-view 1400 of the line and space image 1408 of substrate 1404, whereas FIG. 14B depicts a tilted-view 1450 of the of the line and space image 1458 of substrate 1404, and whereas FIG. 14C is a side-view 1460 of the line and space image 1472 of substrate 1404 with the CHF3/Ar first treatment, the images taken after the full oxide and the APF etch processes. FIG. 14C also shows the critical dimensions (CDs) of the structure including a first pitch 1464, the bottom CD 1466, the height of the structure cap 1462, the height below the structure cap 1468, and a second pitch 1470. Critical dimensions of the substrate are tightly controlled in various steps of the etching scheme in order to achieve the target integration objectives.

FIG. 15A depicts a top-view 1500 of the line and space image 1508 of substrate 1504, whereas FIG. 15B depicts a tilted-view 1530 of the of the line and space image 1538 of substrate 1504, and whereas FIG. 15C is a side-view 1560 of the line and space image 1572 of substrate 1504 with the CH3/Ar first treatment, the images taken after the full oxide and the APF etch processes. FIG. 15C also shows the critical dimensions (CDs) of the structure including the pitch 1562, the bottom CD 1568, the height of the structure cap 1564 and the height below the structure cap 1566. Critical dimensions of the substrate are tightly controlled in various steps of the etching scheme in order to achieve the target integration objectives.

Figure 16:
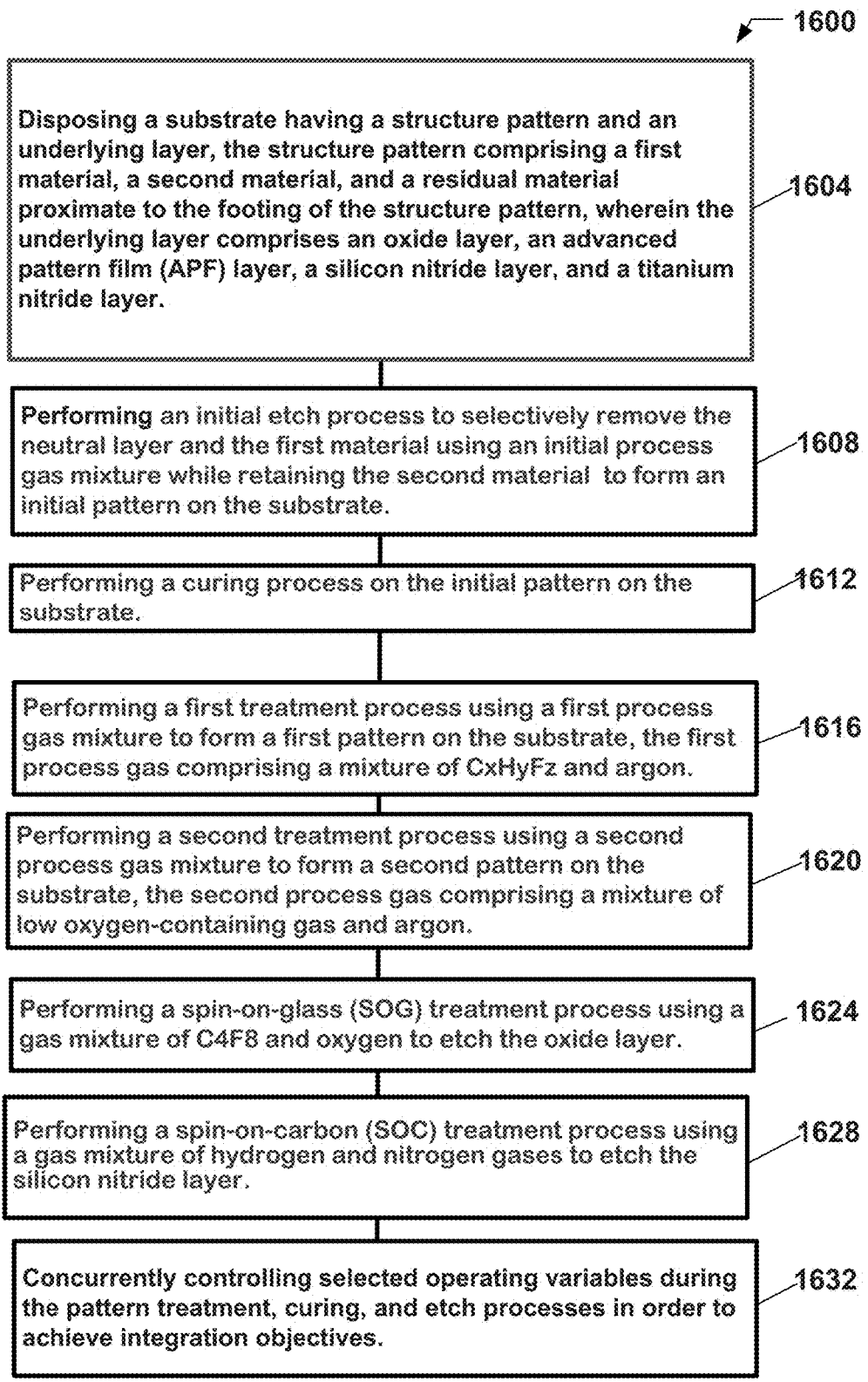
FIG. 16 is an exemplary process flow chart for a method of performing an integration process for a substrate using a directed self-assembly patterning process in one embodiment of the present invention.

FIG. 16 is an exemplary process flow chart 1600 for a method of performing an integration process for a substrate using a patterning scheme in one embodiment of the present invention. In operation 1604, a substrate having a structure pattern and an underlying layer is disposed in an etching system, the structure pattern comprising a first material, a second material, and a neutral layer, wherein the underlying layer comprises an oxide layer, an advanced pattern film (APF) layer, a silicon nitride layer, and a titanium nitride layer. In an embodiment, the first material and the second material can be directed self-assembly materials. Directed self-assembly materials can be block copolymers (BCP). In another embodiment, the first material can be a first block copolymer and the second material can be a second block copolymer. In yet another embodiment, the first block copolymer can be PMMA and a second copolymer can be polystyrene (PS). Other materials or directed self-assembly materials, or polymers can also be used.

In operation 1608, an initial etch process to selectively remove the neutral layer and the first material using an initial process gas mixture is performed while retaining the second material to form an initial pattern on the substrate. The initial gas mixture can include O2/Ar where O2 has a flow rate of about 50 sccm and the Ar has a flowrate of about 850 sccm for about 8 seconds. In an embodiment, the first material is PMMA and the second material is PS, and the initial etch process selectively remove the neutral layer and the PMMA, leaving the PS. The initial etch also include a PS processing using AR at a flowrate of about 200 sccm for about 10 seconds. In operation 1612, a curing process is performed on the initial pattern on the substrate, using HBr at about 90 sccm and CH3F at about 20 sccm for about 10 seconds. Other chemistries and corresponding operating variable ranges can be used to perform the initial etch and curing process.

In operations 1616, a first treatment process using a first process gas mixture is performed to form a first pattern on the substrate. The first process gas mixture can comprise a mixture of $C_xH_yF_z$ and argon. The $C_xH_yF_z$ can be C4F8/Ar, CH4/Ar, CH3/Ar, CHF3/Ar, and/or the like. Other gas mixtures with the capabilities of $C_xH_yF_z$ and argon the can also be used. The $C_xH_yF_z$ can have a flowrate from 5 to 35 sccm, 5 to 25 sccm and the argon can have a flowrate from 40 to 60 sccm, or 61 to 184 sccm.

In another embodiment, the $C_xH_yF_z$ can be in a range 5 to 25 sccm and from 40 to 60 sccm for Ar, the pressure can be in a range from 40 to 60 mT, the upper power 100 to 350 W, the lower power can be zero or 30 to 60 W and the process time can be in a range from 5 to 20 sec.

In operation 1620, a second treatment process using a second process gas mixture is performed to form a second pattern on the substrate. The second process gas can comprise a mixture of low oxygen-containing gas and argon. In operation 1624, a spin-on-glass (SOG) treatment process is performed using a gas mixture of C4F8 and oxygen to etch the oxide layer. In operation 1628, a spin-on-carbon (SOC) treatment process is performed using a gas mixture of hydrogen and nitrogen gases to etch the silicon nitride layer.

In operation 1632, selected operating variables are concurrently controlled during the pattern treatment, curing, and etch processes in order to achieve integration objectives. The target integration objectives can include a target line edge roughness (LER) of the pattern on the substrate can be in a range from 1.60 to 2.50 nm or 1.0 to 1.5 nm, no residual footing, and a target substrate throughput.

The inventors ran tests that identified optimum ranges of operating variables that contributed most to achieving the integration objectives. The top seven operating variables include the source power (or the high radio frequency power), the electrostatic chuck temperature, the bias power (or low frequency power), the argon flow rate, the $C_xH_yF_z$ flow rate, the process time, and the pressure in the processing chamber. A first selected operating variable can have their own optimal range for good results but these results needs to be balanced with the impact of other operating variables that may interact and affect the selected variable. For example, a target deposition rate of the plasma species on the substrate may yield a good operating value at a flow rate of a $C_xH_yF_z$ in a process gas mixture but would yield a different deposition rate if the flow rate of another gas such argon in the same process gas mixture was varied. Thus, multiple concurrent optimizations of the operating variables that show significant sensitivity to achieving integration objectives needs to be performed for different applications and embodiments of the present invention.

Figure 17A:
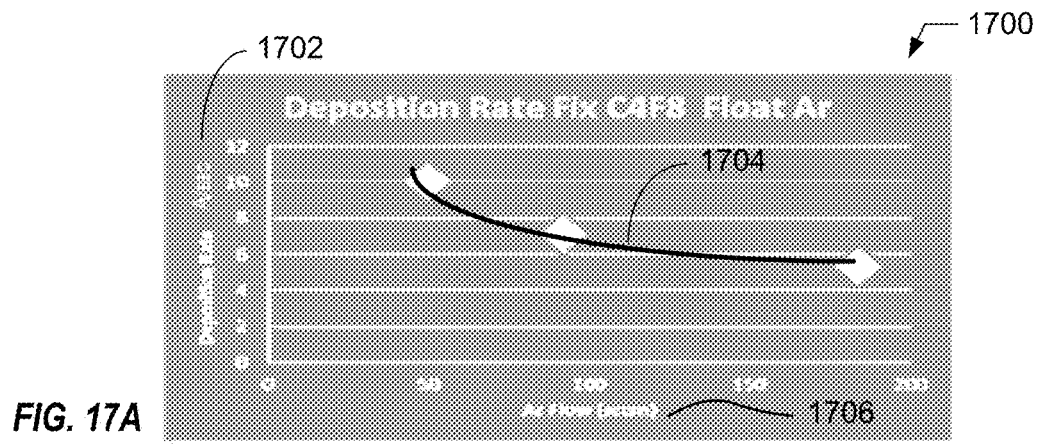
Figure 17B:
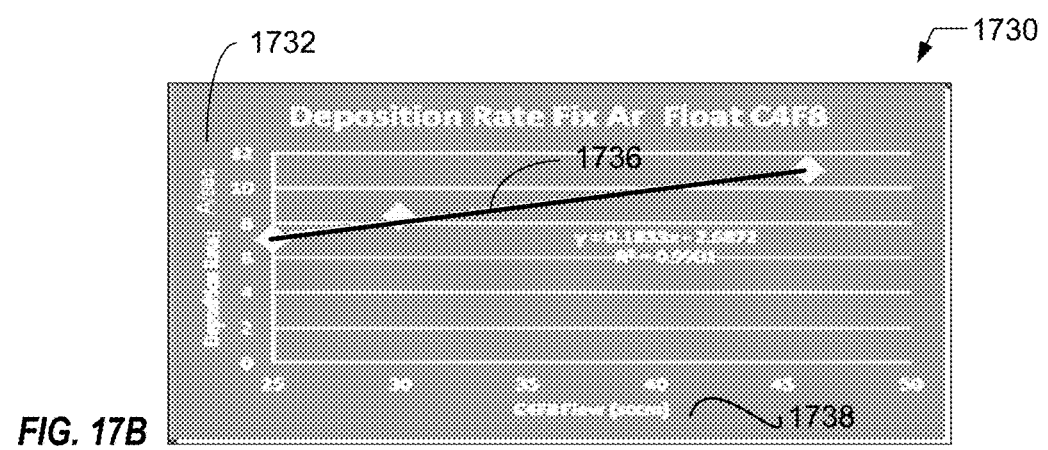
Figure 17C:
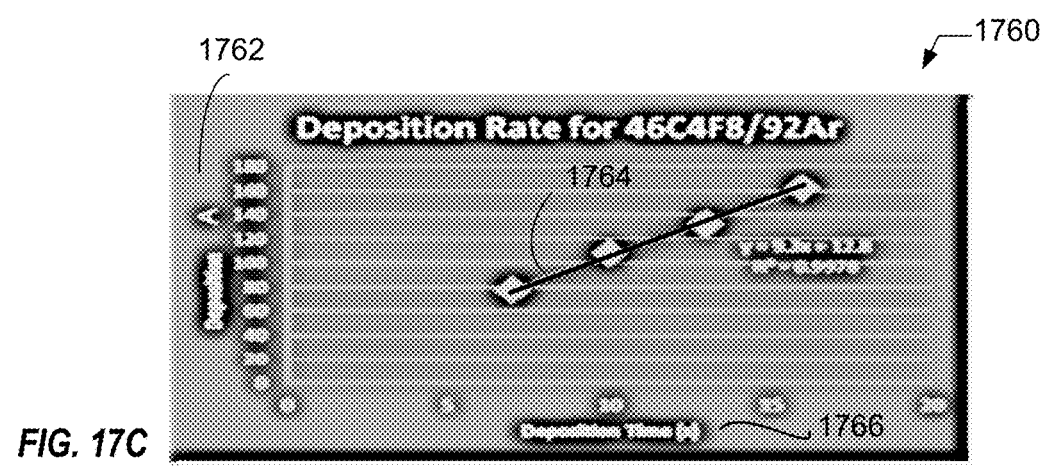
FIG. 17C is an exemplary graph of the deposition depth in Å in the Y-axis as a function of deposition time in seconds in the X-axis.

FIG. 17A, FIG. 17B, and FIG. 17C illustrate an example of determining the flowrates of C4F8 and Ar in the first treatment process that is needed to achieve a target deposition rate of the plasma species. Referring now to FIG. 17A, FIG. 17A is an exemplary graph 1700 of the deposition rate 1702 in the Y-axis in Å (Angstrom) per second of the plasma species. The C4F8 is set to a fixed value and Ar flow rate 1706 is varied from 50 to 200 sccm in the X-axis and highlighted by curve 1704. A deposition rate of about 10 Å per second is used as a reference.

FIG. 17B is an exemplary graph 1730 of the deposition rate 1732 of the plasma species as a function of $C_xH_yF_z$ flow rate in the first treatment process of the structure pattern. The Ar is set to a fixed value and C4F8 flow rate 1736 in sccm is varied from 25 to 45 sccm in the X-axis, highlighted in curve 1736. In order to achieve the deposition rate of about 10 Å per second which the reference used in FIG. 17A, the comparable flow rate of C4F8 is about 46 sccm. FIG. 17C is an exemplary graph 1760 of the deposition depth in Å 1762 in the Y-axis as a function of deposition time in seconds 1766 in the X-axis, highlighted in curve 1764.

Figure 18:
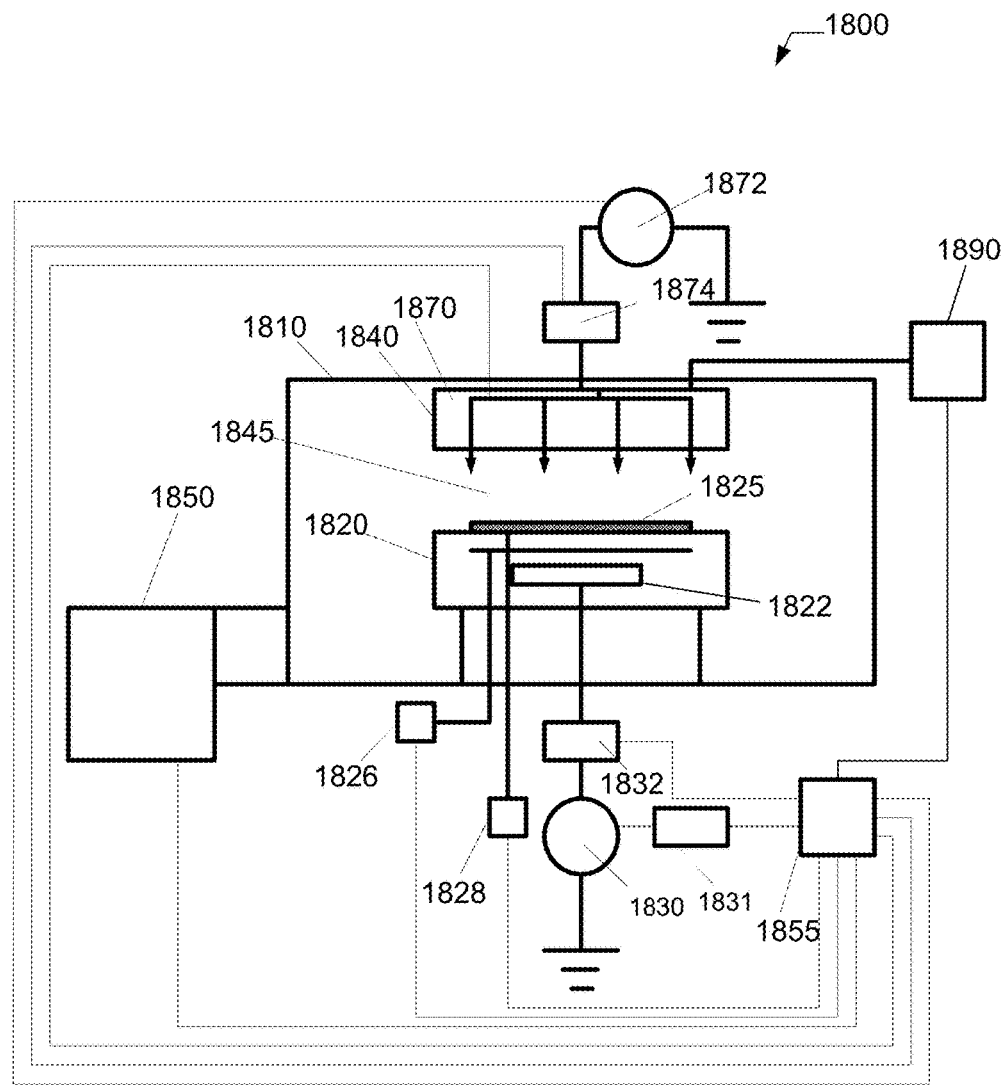
FIG. 18 is an exemplary systems chart depicting a controller of an integration system processing metrology data to facilitate process control of operations and achieve integration objectives.

FIG. 18 is an embodiment of a system 1800 for performing a series of etching, curing, SOG, SOC, a gas treatment, post heat treatment, and other processes. In a further embodiment, the system 1800 may be further configured for curing and etching BCP layers. An etch treatment system 1800 configured to perform the above identified process conditions is depicted in FIG. 18 comprising a processing chamber 1810, substrate holder 1820, upon which a substrate 1825 to be processed is affixed, and vacuum pumping system 1850. Substrate 1825 can be a semiconductor substrate, a wafer, a flat panel display, or a liquid crystal display. Processing chamber 1810 can be configured to facilitate etching the processing region 1845 in the vicinity of a surface of substrate 1825. An ionizable gas or mixture of process gases is introduced via a gas distribution system 1840. For a given flow of process gas, the process pressure is adjusted using the vacuum pumping system 1850.

The cure plasma may include chemistries such as Ar/H2, HBr, N2/H2, etc., which has the capability of generating VUV photon flux for polymer curing. The curing effect may enhance the etch resistance of PS regions, thereby freezing the bulk defects during plasma PMMA removal. In such an embodiment, defect visibility with CDSEM is improved. Accordingly, the metrology process may quantify the defects made visible by the VUV curing process and generate a defect profile of the top layer. Consequently, feedback may be obtained for optimization of lithography processes, and for mitigation of further defects.

Substrate 1825 can be affixed to the substrate holder 1820 via a clamping system (not shown), such as a mechanical clamping system or an electrical clamping system (e.g., an electrostatic clamping system). Furthermore, substrate holder 1820 can include a heating system (not shown) or a cooling system (not shown) that is configured to adjust and/or control the temperature of substrate holder 1820 and substrate 1825. The heating system or cooling system may comprise a re-circulating flow of heat transfer fluid that receives heat from substrate holder 1820 and transfers heat to a heat exchanger system (not shown) when cooling, or transfers heat from the heat exchanger system to substrate holder 1820 when heating. In other embodiments, heating/cooling elements, such as resistive heating elements, or thermo-electric heaters/coolers can be included in the substrate holder 1820, as well as the chamber wall of the processing chamber 1810 and any other component within the processing system 1800.

Additionally, a heat transfer gas can be delivered to the backside of substrate 1825 via a backside gas supply system 1826 in order to improve the gas-gap thermal conductance between substrate 1825 and substrate holder 1820. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1825.

In the embodiment shown in FIG. 18, plasma processing system 1800 can further comprise a direct current (DC) power supply 1890 coupled to the upper electrode 1870 opposing substrate 1825. The upper electrode 1870 may comprise an electrode plate. The electrode plate may comprise a silicon-containing electrode plate. Moreover, the electrode plate may comprise a doped silicon electrode plate. The DC power supply 1890 can include a variable DC power supply. Additionally, the DC power supply 1890 can include a bipolar DC power supply. The DC power supply 1890 can further include a system configured to perform at least one of monitoring, adjusting, or controlling the polarity, current, voltage, or on/off state of the DC power supply 1890. Once plasma is formed, the DC power supply 1890 facilitates the formation of a ballistic electron beam. An electrical filter (not shown) may be utilized to de-couple RF power from the DC power supply 1890.

In the embodiment shown in FIG. 18, substrate holder 1820 can comprise an electrode 1822 through which RF power is coupled to the processing region 1845. For example, substrate holder 1820 can be electrically biased at a RF voltage via the transmission of RF power from a RF generator 1830 through an optional impedance match network 1832 to substrate holder 1820. The RF electrical bias can serve to heat electrons to form and maintain plasma. In this configuration, the system 1800 can operate as a reactive ion etch (RIE) reactor, wherein the chamber and an upper gas injection electrode serve as ground surfaces.

Furthermore, the electrical bias of electrode 1822 at a RF voltage may be pulsed using pulsed bias signal controller 1831. The RF power output from the RF generator 1830 may be pulsed between an off-state and an on-state, for example. Alternately, RF power is applied to the substrate holder electrode at multiple frequencies. Furthermore, impedance match network 1832 can improve the transfer of RF power to plasma in plasma processing chamber 1810 by reducing the reflected power. Match network topologies (e.g. L-type, π-type, T-type, etc.) and automatic control methods are well known to those skilled in the art.

Gas distribution system 1840 may comprise a showerhead design for introducing a mixture of process gases. Alternatively, gas distribution system 1840 may comprise a multi-zone showerhead design for introducing a mixture of process gases, and adjusting the distribution of the mixture of process gases above substrate 1825. For example, the multi-zone showerhead design may be configured to adjust the process gas flow or composition to a substantially peripheral region above substrate 1825 relative to the amount of process gas flow or composition to a substantially central region above substrate 1825. In such an embodiment, gases may be dispensed in a suitable combination to form a VUV cure plasma and/or dry etch plasma within the chamber 1810.

Vacuum pumping system 1850 can include a turbo-molecular vacuum pump (TMP) capable of a pumping speed up to about 18,000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 180 mTorr), a mechanical booster pump and dry roughing pump can be used. Furthermore, a device for monitoring chamber pressure (not shown) can be coupled to the plasma processing chamber 1810.

In an embodiment, the controller 1855 can comprise a microprocessor, memory, and a digital I/O port capable of generating control voltages sufficient to communicate and activate inputs to processing system 1800 as well as monitor outputs from plasma processing system 1800. Moreover, controller 1855 can be coupled to and can exchange information with RF generator 1830, pulsed bias signal controller 1831, impedance match network 1832, the gas distribution system 1840, vacuum pumping system 1850, as well as the substrate heating/cooling system (not shown), the backside gas supply system 1826, and/or the electrostatic clamping system 1820. For example, a program stored in the memory can be utilized to activate the inputs to the aforementioned components of processing system 1800 according to a process recipe in order to perform a plasma assisted process, such as a plasma etch process or a post heating treatment process, on substrate 1825.

In addition, the processing system 1800 can further comprise an upper electrode 1870 to which RF power can be coupled from RF generator 1872 through optional impedance match network 1874. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 180 MHz. Moreover, controller 1855 is coupled to RF generator 1872 and impedance match network 1874 in order to control the application of RF power to upper electrode 1870. The design and implementation of an upper electrode is well known to those skilled in the art. The upper electrode 1870 and the gas distribution system 1840 can be designed within the same chamber assembly, as shown. Alternatively, upper electrode 1870 may comprise a multi-zone electrode design for adjusting the RF power distribution coupled to plasma above substrate 1825. For example, the upper electrode 1870 may be segmented into a center electrode and an edge electrode.

Depending on the applications, additional devices such as sensors or metrology devices can be coupled to the processing chamber 1810 and to the controller 1855 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of patterning a layer on a substrate using an integration scheme, the method comprising:
   disposing the substrate in a processing chamber, the substrate having a structure pattern layer, a neutral layer, and an underlying layer, the structure pattern layer comprising a first material being a first block copolymer and a second material being a second block copolymer, the first and second block copolymers being self-assembled materials, the underlying layer comprising an oxide layer, an advanced pattern (APF) layer, a silicon nitride layer, and a titanium nitride layer;
   performing a first treatment process using a first process gas mixture to form a first pattern on the substrate, the first process gas comprising a mixture of $C_xH_yF_z$ and argon;
   performing a second treatment process using a second process gas mixture to form a second pattern on the substrate, the second process gas comprising a mixture of an oxygen-containing gas and argon; and
   concurrently controlling selected two or more operating variables of the integration scheme in order to achieve target integration objectives.

2. The method of claim 1, wherein the $C_xH_yF_z$ in the first process gas mixture is $C_4F_8$ and the oxygen-containing gas in the second process gas mixture is $O_2$.

3. The method of claim 1, wherein the $C_xH_yF_z$ in the first process gas mixture is $CH_4$ and the oxygen-containing gas in the second process gas mixture is $O_2$.

4. The method of claim 1, wherein the $C_xH_yF_z$ in the first process gas mixture is $CH_3F$ and the oxygen-containing gas in the-second process gas mixture is $O_2$.

5. The method of claim 1, wherein the $C_xH_yF_z$ in the first process gas mixture is $CHF_3$ and the oxygen-containing gas in the second process gas mixture is $O_2$.

6. The method of claim 1, wherein the target integration objectives include a target line edge roughness (LER) of the pattern on the substrate in the range from 1.0 to 1.5 nm.

7. The method of claim 1, wherein the two or more operating variables includes at least two of a source power, a bias power, an upper radio frequency, a lower radio frequency, a pressure, an electrostatic chuck (ESC) temperature, a flow rate of each gas of the first process gas mixture, a flow rate of each gas of the second process gas mixture, a flow rate of each of the initial process gas mixture, or a process time.

8. The method of claim 1, wherein a source power is a range from 100 to 350 W and a bias power is in a range from 30 to 60 W.

9. The method of claim 1, wherein an electrostatic chuck (ESC) temperature is in a range from 0 to 40 degrees C.

10. The method of claim 1, wherein a $C_xH_yF_z$ flow rate is from 5 to 30 sccm.

11. The method of claim 1, wherein an Ar flow rate in the first treatment process is in the range from 50 to 184 sccm.

12. The method of claim 1, wherein a process time is in the range from 5 to 18 seconds and a pressure is in a range from 10 to 40 mT.

13. The method of claim 1, wherein in situ measurements from sensors and metrology devices are used to adjust and concurrently control the selected two or more operating variables of the integration scheme in order to achieve the target integration objectives.

14. The method of claim 1, wherein the oxygen-containing gas is $O_2$ and, during the second treatment process, a flow rate of $O_2$ is 2 to 5 sccm and a flow rate of argon is 40 to 70 sccm.

15. The method of claim 1:
   wherein the first block copolymer is poly-(methylmethacrylate), and the second block copolymer is polystyrene; and/or
   wherein the $C_xH_yF_z$ is $C_4F_8$, $CH_4$, $CHF_3$, or $CH_3F$.

16. The method of claim 15:
wherein a target etch selectivity of the first block copolymer over the second block copolymer is in a range from 2.0 to 3.0 nm and/or
wherein the target integration objectives include a target line edge roughness (LER) of the pattern on the substrate is in a range from 1.5 to 2.4 nm, no residual footing, and/or a target substrate throughput.

17. The method of claim 16, wherein prior to performing the first treatment process, the method further comprises:
performing an initial etch process to selectively remove the neutral layer and the first material using an initial process gas mixture while retaining the second material to form an initial pattern on the substrate; and
performing a curing process on the initial pattern on the substrate.

18. The method of claim 17, wherein after performing the second treatment process, the method further comprises:
performing a spin-on-glass (SOG) treatment process using a gas mixture of $C_4F_8$ and oxygen to etch the oxide layer; and
performing a spin-on-carbon (SOC) treatment process using a gas mixture of hydrogen and nitrogen gases to etch the silicon nitride layer.

19. A method of patterning a layer on a substrate using an integration scheme, the method comprising:
disposing the substrate in a processing chamber, the substrate having a structure pattern layer, a neutral layer, and an underlying layer, the structure pattern layer comprising a first material being a first block copolymer and a second material being a second block copolymer, the first and second block copolymers being self-assembled materials, the underlying layer comprising an oxide layer and a silicon nitride layer;
performing a first treatment process using a first process gas mixture to form a first pattern on the substrate, the first process gas comprising a mixture of $C_xH_yF_z$ and argon;
performing a second treatment process using a second process gas mixture to form a second pattern on the substrate, the second process gas comprising a mixture of an oxygen-containing gas and argon;
after performing the second treatment process:
performing a spin-on-glass (SOG) treatment process using a gas mixture of $C_4F_8$ and oxygen to etch the oxide layer; and
performing a spin-on-carbon (SOC) treatment process using a gas mixture of hydrogen and nitrogen gases to etch the silicon nitride layer; and
concurrently controlling selected two or more operating variables of the integration scheme in order to achieve target integration objectives.

20. A method of patterning a layer on a substrate using an integration scheme, the method comprising:
disposing the substrate in a processing chamber, the substrate having a structure pattern layer, a neutral layer, and an underlying layer, the structure pattern layer comprising a first material being a first block copolymer and a second material being a second block copolymer, the first and second block copolymers being self-assembled materials;
performing a first treatment process using a first process gas mixture to form a first pattern on the substrate, the first process gas comprising a mixture of $C_xH_yF_z$ and argon;
performing a second treatment process using a second process gas mixture to form a second pattern on the substrate, the second process gas comprising a mixture of an oxygen-containing gas and argon; and
concurrently controlling selected two or more operating variables of the integration scheme in at least one of the first treatment process or the second treatment process in order to achieve target integration objectives,
wherein in situ measurements from sensors and metrology devices are used to adjust and concurrently control the selected two or more operating variables of the integration scheme in order to achieve the target integration objectives.

* * * * *

UNITED STATES PATENT AND TRADEMARK OFFICE
CERTIFICATE OF CORRECTION

PATENT NO. : 9,978,563 B2
APPLICATION NO. : 15/266397
DATED : May 22, 2018
INVENTOR(S) : Vinh Luong et al.

It is certified that error appears in the above-identified patent and that said Letters Patent is hereby corrected as shown below:

In the Specification

In Column 1, Line 11, "(LER) and achieve other" should read --(LER) and achieving other--.

In Column 2, Line 8, "copolymer with A and Bblocks" should read --copolymer with A and B blocks--.

In Column 2, Line 25, "chemical pattern comprises of a surface" should read --chemical pattern comprises a surface--.

In Column 3, Line 45, "2B depicts schematic of" should read --2B depicts a schematic of--.

In Column 3, Lines 49-50, "FIG. 2D depicts schematic of the substrate a second process gas" should read --FIG. 2D depicts a schematic of the substrate using a second process gas--.

In Column 4, Line 29, "where FIG. 12B depicts a tilted-view of the of the line" should read --where FIG. 12B depicts a tilted-view of the line--.

In Column 4, Line 34, "where FIG. 13B depicts a tilted-view of the of the line" should read --where FIG. 13B depicts a tilted-view of the line--.

In Column 4, Line 39, "where FIG. 14B depicts a tilted-view of the of the line" should read --where FIG. 14B depicts a tilted-view of the line--.

In Column 4, Line 44, "where FIG. 15B depicts a tilted-view of the of the line" should read --where FIG. 15B depicts a tilted-view of the line--.

In Column 5, Line 46, "including Xthree polymer blocks" should read --including three polymer blocks--.

Signed and Sealed this
Fourth Day of September, 2018

Andrei Iancu
*Director of the United States Patent and Trademark Office*

CERTIFICATE OF CORRECTION (continued)
U.S. Pat. No. 9,978,563 B2

In Column 10, Line 55, "tilted-view 1230 of the of the line" should read --tilted-view 1230 of the line--.

In Column 11, Line 1, "tilted-view 1330 of the of the line" should read --tilted-view 1330 of the line--.

In Column 11, Line 13, "tilted-view 1450 of the of the line" should read --tilted-view 1450 of the line--.

In Column 11, Line 26, "tilted-view 1530 of the of the line" should read --tilted-view 1530 of the line--.

In Column 11, Lines 64-65, "The initial etch also include a PS processing using AR" should read --The initial etch also includes PS processing using Ar--.

In Column 12, Line 10, "capabilities of $C_xH_yF_z$ and argon the can" should read --capabilities of $C_xH_yF_z$ and argon can--.

In Column 12, Line 32, "(LER) of the pattern on the substrate can be" should read --(LER) of the pattern on the substrate, which can be--.

In Column 12, Lines 43-44, "their own optimal range for good results but these results needs to be" should read --its own optimal range for good results but these results need to be--.

In Column 12, Lines 49-50, "another gas such argon in the same" should read --another gas such as argon in the same--.

In Column 12, Line 53, "objectives needs to be performed" should read --objectives need to be performed--.

In Column 13, Line 27, "which has the capability" should read --which have the capability--.

In the Claims

In Column 16, Line 26, Claim 4, "in the-second process gas" should read --in the second process gas--.

In Column 16, Line 42, Claim 8, "wherein a source power is a" should read --wherein a source power is in a--.

In Column 17, Lines 6-7, Claim 16, "(LER) of the pattern on the substrate is in a range" should read --(LER) of the pattern on the substrate in a range--.

In Column 17, Line 20, Claim 18, "using a gas mixture of $C_4F_8$and oxygen" should read --using a gas mixture of $C_4F_8$ and oxygen--.